(12) United States Patent
Takano et al.

(10) Patent No.: US 8,377,832 B2
(45) Date of Patent: Feb. 19, 2013

(54) METHOD FOR MANUFACTURING SEMICONDUCTOR DEVICE

(75) Inventors: Kazutoyo Takano, Tokyo (JP); Junichi Murakami, Fukuoka (JP); Tadaharu Minato, Tokyo (JP)

(73) Assignee: Mitsubishi Electric Corporation (JP)

( * ) Notice: Subject to any disclaimer, the term of this patent is extended or adjusted under 35 U.S.C. 154(b) by 449 days.

(21) Appl. No.: 12/395,875

(22) Filed: Mar. 2, 2009

(65) Prior Publication Data

US 2010/0062599 A1 Mar. 11, 2010

(30) Foreign Application Priority Data

Sep. 5, 2008 (JP) ................................. 2008-228084

(51) Int. Cl.
*H01L 21/00* (2006.01)

(52) U.S. Cl. ................. 438/764; 257/636; 257/E21.158

(58) Field of Classification Search ................. 438/597, 438/778, 764, 609; 257/E21.575, E21.158, 257/E21.159, 636
See application file for complete search history.

(56) References Cited

U.S. PATENT DOCUMENTS

| | | | | |
|---|---|---|---|---|
| 3,633,077 A * | 1/1972 | Tsuji et al. | ..................... | 257/461 |
| 4,014,037 A * | 3/1977 | Matsushita et al. | ........... | 257/636 |
| 4,080,619 A * | 3/1978 | Suzuki | ........................... | 257/591 |
| 4,081,292 A * | 3/1978 | Aoki et al. | ..................... | 438/309 |
| 4,084,986 A * | 4/1978 | Aoki et al. | ..................... | 438/372 |
| 4,176,372 A * | 11/1979 | Matsushita et al. | ........... | 257/372 |
| 4,194,934 A * | 3/1980 | Blaske et al. | .................. | 438/542 |
| 4,244,000 A * | 1/1981 | Ueda et al. | ..................... | 257/110 |
| 4,332,837 A * | 6/1982 | Peyre-Lavigne | .............. | 438/660 |
| 4,375,125 A * | 3/1983 | Byatt | ............................. | 438/762 |
| 4,403,239 A * | 9/1983 | Yamazaki | ........................ | 257/37 |
| 4,420,765 A * | 12/1983 | Tarng | ............................. | 257/636 |
| 4,485,393 A * | 11/1984 | Kumamaru et al. | .......... | 257/536 |
| 4,580,156 A * | 4/1986 | Comizzoli | ...................... | 257/489 |
| 4,585,489 A * | 4/1986 | Hiraki et al. | ................... | 438/764 |
| 4,691,223 A * | 9/1987 | Murakami et al. | ............ | 257/489 |
| 4,707,719 A * | 11/1987 | Whight | .......................... | 257/489 |
| 4,778,776 A * | 10/1988 | Tong et al. | ..................... | 438/694 |
| 4,803,528 A * | 2/1989 | Pankove | ........................ | 257/410 |
| 4,825,266 A * | 4/1989 | Whight | .......................... | 257/605 |
| 4,879,586 A * | 11/1989 | Brostrom et al. | ............. | 257/489 |

(Continued)

FOREIGN PATENT DOCUMENTS

| | | | |
|---|---|---|---|
| JP | 53053964 A | * | 5/1978 |
| JP | 55039631 A | * | 3/1980 |

(Continued)

OTHER PUBLICATIONS

Office Action issued Feb. 8. 2011, in Korea Patent Application No. 10-2009-0043855.

*Primary Examiner* — Jarrett Stark
*Assistant Examiner* — Michele Fan
(74) *Attorney, Agent, or Firm* — Studebaker & Brackett PC; Donald R. Studebaker (57) ABSTRACT

A method for manufacturing a semiconductor device includes the steps of forming a P-type region on a surface of a semiconductor substrate, forming at least one Al electrode on the P-type region, forming an interlayer film in contact with the at least one Al electrode, the interlayer film being of a material which is less reactive with Si than is Al, and forming a semi-insulating film on the interlayer film, the semi-insulating film containing Si.

12 Claims, 10 Drawing Sheets

U.S. PATENT DOCUMENTS

| | | | | |
|---|---|---|---|---|
| 4,947,232 | A | * | 8/1990 | Ashida et al. ................. 257/336 |
| 5,031,021 | A | * | 7/1991 | Baba et al. .................... 257/490 |
| 5,086,332 | A | * | 2/1992 | Nakagawa et al. ............ 257/538 |
| 5,107,323 | A | * | 4/1992 | Knolle et al. ................. 257/636 |
| 5,325,385 | A | * | 6/1994 | Kasukawa et al. ......... 372/46.01 |
| 5,552,625 | A | * | 9/1996 | Murakami et al. ............ 257/409 |
| 5,637,908 | A | * | 6/1997 | Lowther et al. ............... 257/489 |
| 5,677,562 | A | * | 10/1997 | Korwin-Pawlowski et al. ............................. 257/490 |
| 5,804,868 | A | * | 9/1998 | Kobayashi et al. ........... 257/630 |
| 5,945,692 | A | * | 8/1999 | Yano et al. .................... 257/139 |
| 6,040,219 | A | * | 3/2000 | Park et al. ..................... 438/268 |
| 6,137,509 | A | * | 10/2000 | Hayasaki ......................... 347/59 |
| 6,346,444 | B1 | * | 2/2002 | Park et al. ..................... 438/268 |
| 6,429,501 | B1 | * | 8/2002 | Tsuchitani et al. ............ 257/493 |
| 6,660,570 | B2 | * | 12/2003 | Kim et al. ..................... 438/133 |
| 7,187,058 | B2 | * | 3/2007 | Schmidt ......................... 257/626 |
| 2003/0003699 | A1 | * | 1/2003 | Matsuzaki et al. ............ 438/570 |
| 2003/0038333 | A1 | * | 2/2003 | Satoh et al. .................... 257/471 |
| 2003/0218220 | A1 | * | 11/2003 | Takahashi et al. ............ 257/409 |
| 2004/0104455 | A1 | * | 6/2004 | Shimizu ........................ 257/659 |
| 2006/0027832 | A1 | * | 2/2006 | Mariyama et al. ............ 257/118 |
| 2008/0169526 | A1 | * | 7/2008 | Wakimoto et al. ............ 257/490 |

FOREIGN PATENT DOCUMENTS

| | | | | |
|---|---|---|---|---|
| JP | 57188843 | A | * | 11/1982 |
| JP | 60042859 | A | * | 3/1985 |
| JP | 61036934 | A | * | 2/1986 |
| JP | 61051929 | A | * | 3/1986 |
| JP | 4-212468 | | | 8/1992 |
| JP | 04212468 | A | * | 8/1992 |
| JP | 6-275852 | | | 9/1994 |
| JP | 07099307 | A | * | 4/1995 |
| JP | 2000-164622 | | | 6/2000 |
| JP | 2000-183366 | | | 6/2000 |

* cited by examiner

STEP100

FIG. 3

STEP102

FIG. 4

STEP 104

FIG. 5

STEP 106

FIG. 6

STEP 108

FIG. 7

STEP 110

METHOD FOR MANUFACTURING SEMICONDUCTOR DEVICE

BACKGROUND OF THE INVENTION

1. Field of the Invention

The present invention relates to a method for manufacturing a semiconductor device having aluminum electrodes with a semi-insulating film formed thereon.

2. Background Art

Semiconductor devices employing Al electrodes have been widely used. In such a semiconductor device, some of these Al electrodes serve as gate and emitter electrodes in the device region and others are formed on guard rings in the guard ring region formed around the device region. A guard ring is a P-type region formed within an N-type substrate to reduce the electric field. As is known in the art, a semi-insulating film may be formed over the Al electrodes to stabilize their potentials.

In such a case, the semi-insulating film continuously extends over the separate Al electrodes formed on the respective guard rings. More specifically, the semi-insulating film covers the guard rings and the spaces therebetween and has the following effects. The formation of the semi-insulating film between the guard rings means that the guard rings are connected to one another through a high resistance, that is, they are not fully insulated from each other. This makes the potentials of the guard rings substantially equal, thereby increasing the dielectric strength of the device. Furthermore, hot electrons trapped in the guard rings leave the rings and enter the semi-insulating film, thereby stabilizing the potentials of the guard rings.

The edge termination dimensions (or width) of the semiconductor device can be reduced by taking advantage of the increase in the dielectric strength of the device, the stabilization of the potentials of the guard rings, etc. which result from the use of the semi-insulating film. More specifically, since the use of the semi-insulating film ensures that the device has sufficient dielectric strength, a dielectric strength enhancing region thereof called "edge termination" can be narrowed. Further, forming a semi-insulating film in contact with the gate and emitter electrodes (i.e., electrodes in the device region) results in stabilizing their potentials.

Techniques for enhancing the dielectric strength of a semiconductor device, such as described above, are disclosed, e.g., in the following patent publications. Japanese Laid-Open Patent Publication No. 04-212468 (1992) discloses a semiconductor device in which a low resistance film is disposed over field plates to increase the dielectric strength of the device. Japanese Laid-Open Patent Publication No. 2000-183366 discloses a semiconductor device in which a semi-insulating passivation film is disposed over field limiting rings (or guard rings) so that the rings receive equal intensities of electric field resulting in increased dielectric strength of the device. Further, Japanese Laid-Open Patent Publication No. 06-275852 (1994) discloses a semiconductor device in which the Al electrodes on guard rings and on channel stoppers are in contact with a semi-insulating film.

As described above, the Al electrodes in the device region and guard ring region of the semiconductor device may be covered with a semi-insulating film to stabilize the potentials of these electrodes and enhance the dielectric strength of the device. However, this arrangement is disadvantageous in that in the manufacture of the device, the Al electrodes may chemically react with Si contained in the semi-insulating film due to the heat generated when forming the semi-insulating film or due to the heating of the semiconductor substrate at a subsequent step. In the past this reaction has caused such problems as increased contact resistance between the Al electrodes and the semi-insulating film, poor appearance, reduced resistance between isolated Al lines (which may ultimately lead to shorting therebetween), and degraded reliability of the device. It should be noted that not only the guard ring region but also the device region can suffer these problems, since the above chemical reaction may occur wherever an Al electrode is in contact with a semi-insulating film.

SUMMARY OF THE INVENTION

The present invention has been devised to solve the above problems. It is, therefore, an object of the present invention to provide an improved method for manufacturing a semiconductor device in which Al electrodes are covered with a semi-insulating film to stabilize the potentials of these electrodes and to increase the dielectric strength of the device.

According to one aspect of the present invention, a method for manufacturing a semiconductor device includes the steps of forming a P-type region on a surface of a semiconductor substrate, forming at least one Al electrode on the P-type region, forming an interlayer film in contact with the at least one Al electrode, the interlayer film being of a material which is less reactive with Si than is Al, and forming a semi-insulating film on the interlayer film, the semi-insulating film containing Si.

Other and further objects, features and advantages of the invention will appear more fully from the following description.

DETAILED DESCRIPTION OF THE PREFERRED EMBODIMENTS

First Embodiment

A first embodiment of the present invention relates to a method for manufacturing a semiconductor device in which Al electrodes are covered with a semi-insulating film in such a manner as to prevent chemical reaction between the Al electrodes and the semi-insulating film. In the following description of preferred embodiments, like numerals represent like or corresponding parts, or parts of like materials, and these parts may be described only once.

Figure 1:
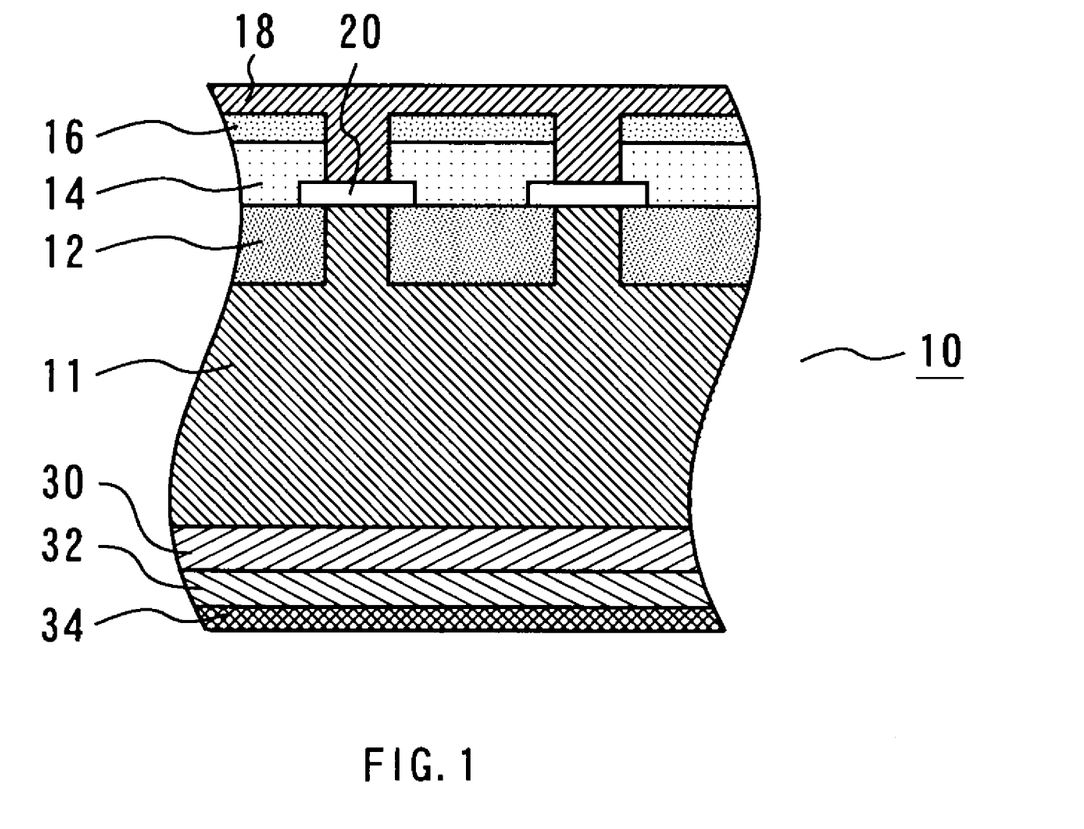
FIG. 1 is cross-sectional view of a semiconductor device.

FIG. 1 is a cross-sectional view of a semiconductor device manufactured by the method of the present embodiment. This semiconductor device will now be described with reference to FIG. 1. The semiconductor device, 10, includes a dielectric strength enhancing region formed around a device region, and also includes an N-layer 11 which forms a conductivity modulation region, and a plurality of P-type regions, or guard rings, 12 formed in the surface of the N-layer 11. Al electrodes 14 are provided on the respective P-type regions 12. It should be noted that the term "Al electrode," as used in this specification, refers to both pure and impure Al electrodes.

Interlayer films 16 are formed on and in contact with the respective Al electrodes 14. According to the present embodiment, the interlayer films 16 are metal films made of TiN, which is less reactive with Si than is Al. Thus, each P-type region has an Al electrode 14 thereon which in turn has an interlayer film 16 thereon.

Further, a semi-insulating film 18 covers and is in contact with the interlayer films 16. According to the present embodiment, the semi-insulating film 18 is a semi-insulating nitride film. The semi-insulating film 18 also covers the spaces between the Al electrodes 14 and is in contact with these electrodes 14. That is, the semi-insulating film 18 continuously extends over the interlayer films 16 and the spaces between the Al electrodes 14, as shown in FIG. 1. Interlayer insulating films 20 are interposed between the semi-insulating film 18 and the N-layer 11 to prevent their contact.

Further, an N-buffer layer 30, a P-collector layer 32, and a collector electrode 34 are sequentially stacked on the back surface of the N-layer 11. This back side structure results from the fact that the semiconductor device 10 is designed to constitute the peripheral structure of a vertical IGBT, etc. That is, the N-layer 11, the N-buffer layer 30, the P-collector layer 32, and the collector electrode 34 continuously extend through the device region of the IGBT, etc. and through the semiconductor device 10. This completes the description of the semiconductor device 10 manufactured by the method of the present embodiment.

Figure 2:
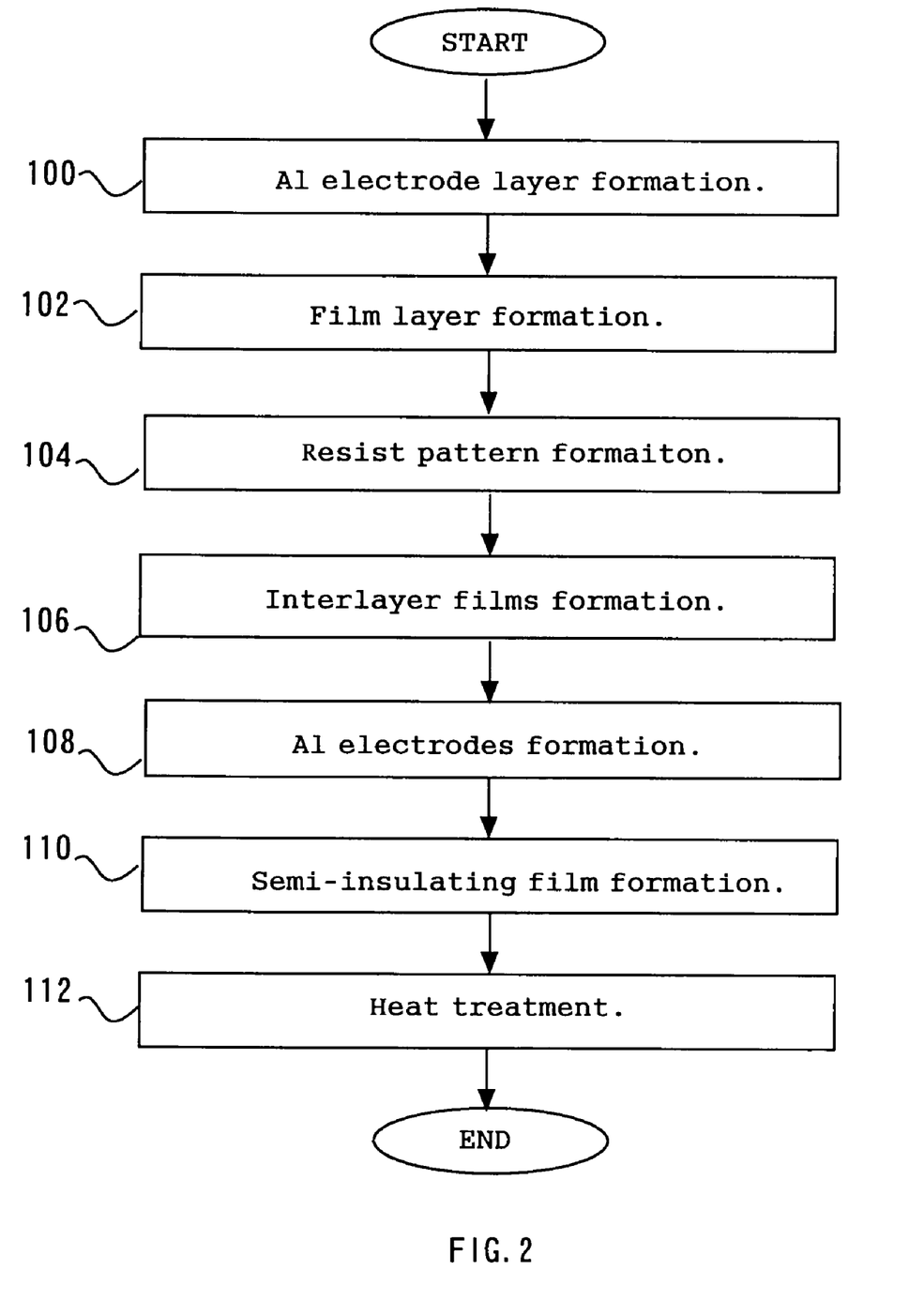
FIG. 2 is a flowchart illustrating manufacturing method.

The method of the present embodiment for manufacturing the semiconductor device 10 will be described with reference to FIGS. 2 to 8. FIG. 2 is a flowchart illustrating this manufacturing method. This flowchart shows the process steps performed after P-type regions 12 (and interlayer insulating films 20) are formed in the surface of a semiconductor substrate by ion implantation of B ions, etc.

Figure 3:
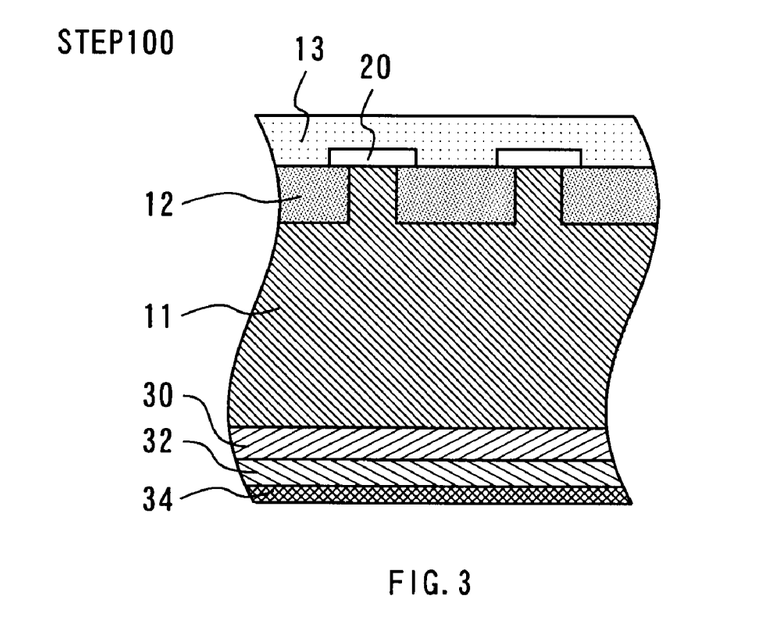
FIG. 3 shows a Al electrode layer formed in step 100.

First, an Al electrode layer 13 is formed at step 100. Specifically, as illustrated by FIG. 3, the Al electrode layer 13 is formed over the top surface of the semiconductor substrate having the P-type regions 12 formed therein. Thus the Al electrode layer 13 covers the P-type regions 12 (serving as guard rings) and the interlayer insulating films 20.

Figure 4:
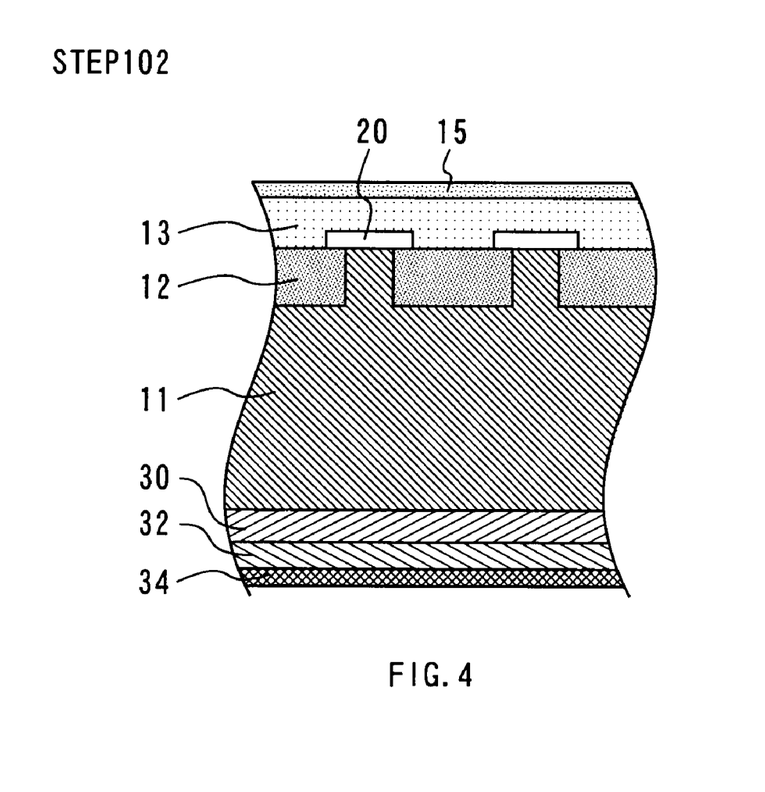
FIG. 4 shows a film layer formed in step 102.

The method then proceeds to step 102 at which a film layer 15 is formed in contact with the Al electrode layer. FIG. 4 illustrates this step.

Figure 5:
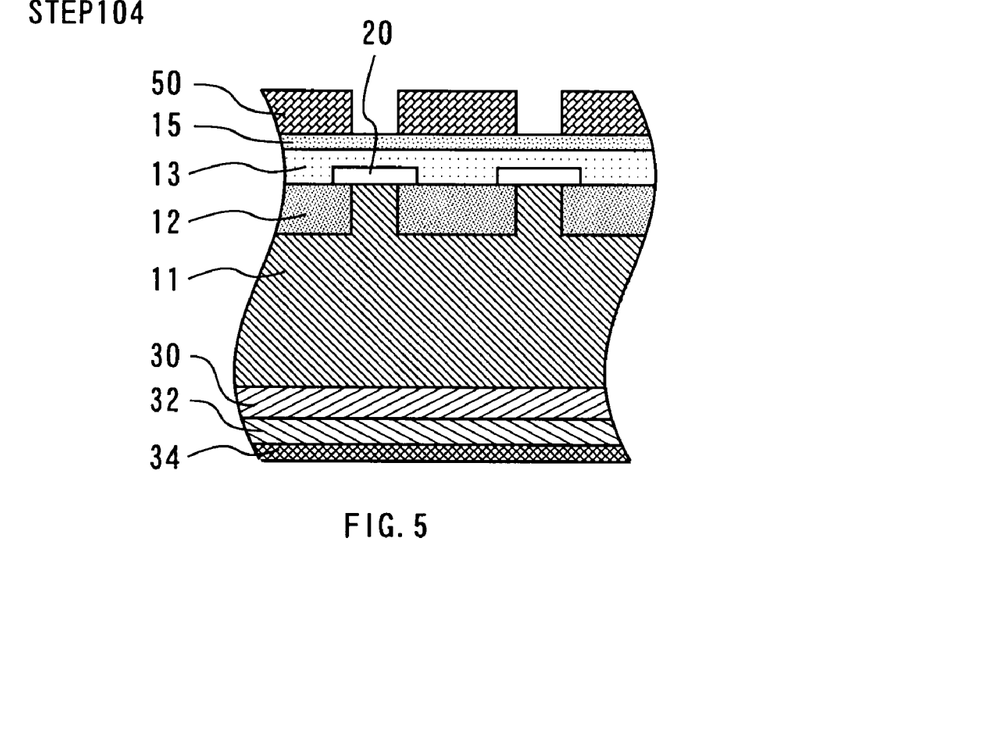
FIG. 5 shows a resist pattern formed in step 104.

The method then proceeds to step 104 at which a resist pattern is formed, which is subsequently used to etch away portions of the film layer 15. More specifically, as illustrated by FIG. 5, a resist is formed and patterned by a known technique such as photolithography into a resist pattern 50 including pattern elements located directly above the P-type regions 12.

Figure 6:
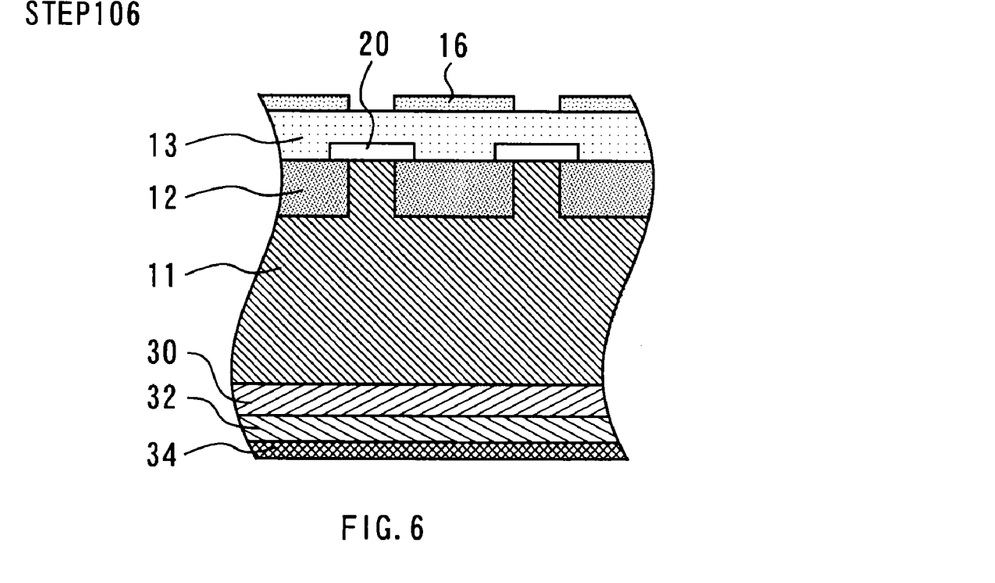
FIG. 6 shows interlayer films formed in step 106.

The method then proceeds to step 106 at which portions of the film layer 15 are etched away using the above resist pattern 50 as a mask, and then the resist pattern 50 is stripped off. More specifically, as illustrated by FIG. 6, the portions of the film layer 15 exposed through the resist pattern 50 are removed by wet etching to form interlayer films 16, and then the resist pattern 50 is removed immediately after completion of the wet etching.

Figure 7:
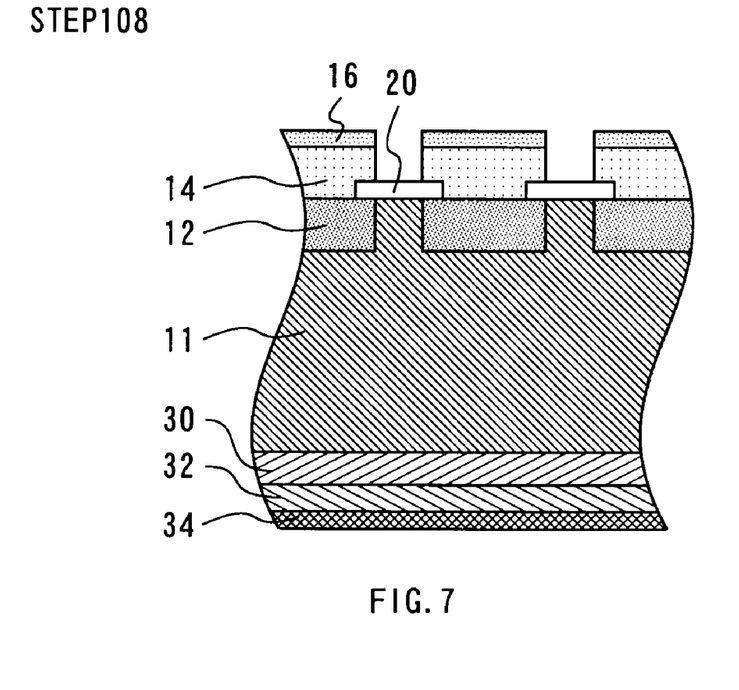
FIG. 7 shows Al electrodes formed in step 108.

The method then proceeds to step 108 at which portions of the Al electrode layer 13 are etched away using the interlayer films 16 as masks. More specifically, as illustrated by FIG. 7, the exposed portions of the Al electrode layer 13 (not covered with the interlayer films 16) are etched away to form Al electrodes 14. That is, the etching in the depth direction is performed until the interlayer insulating films 20 are exposed (thus forming openings).

Figure 8:
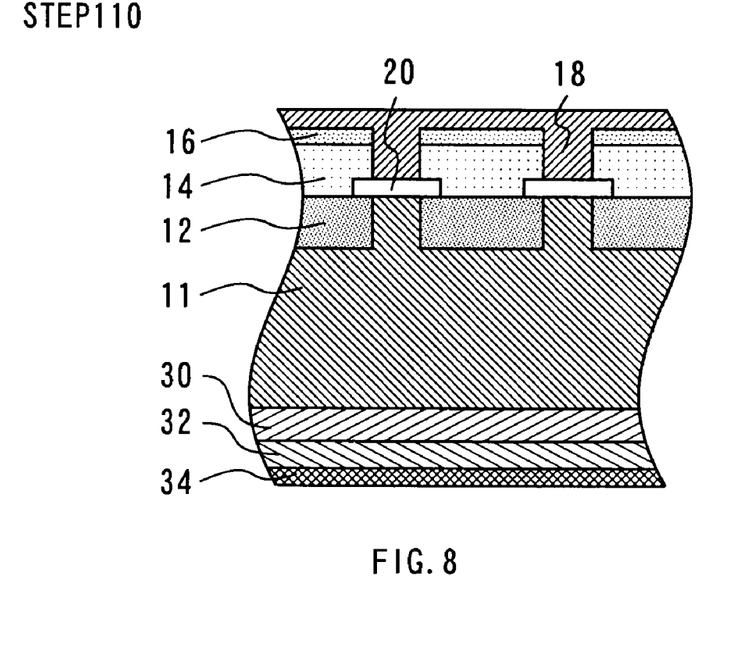
FIG. 8 shows semi-insulating film formed in step 110.

The method then proceeds to step 110 at which a semi-insulating film 18 is formed. More specifically, as illustrated by FIG. 8, the semi-insulating film 18 is formed so as to fill the openings formed by the etching in steps 106 and 108 and to contiguously cover the interlayer films 16. Thus, the semi-insulating film 18 covers the Al electrodes 14 on the P-type regions 12 and the spaces between these electrodes 14. According to the present embodiment, the semi-insulating film 18 is a Si-containing semi-insulating nitride film, which is formed at a substrate temperature of approximately 400° C.

The method then proceeds to step 112 at which a heat treatment is applied to the substrate. More specifically, this heat treatment is performed at a substrate temperature of approximately 400° C. or higher to improve the ohmicity of the electrical contact between the collector electrode 34 and the P-collector layer 32 (described above) formed over the back surface of the N-layer 11. This completes the description of each process step in the method of the present embodiment for manufacturing a semiconductor device.

Conventional methods for manufacturing a semiconductor device, such as described above, are disadvantageous in that the Al electrodes may chemically react with Si contained in the semi-insulating film due to the heat generated when forming the semi-insulating film or due to the heating of the semiconductor substrate at a subsequent step. On the other hand, according to the method of the present embodiment for manufacturing a semiconductor device, the interlayer films 16 of TiN, which is less reactive with Si than is Al, are formed between the semi-insulating film 18 and the Al electrodes 14. This prevents the reaction of the Al electrodes with Si contained in the semi-insulating film due to the heat generated at steps 110 and 112 shown in FIG. 2, thus preventing such problems as increased contact resistance between the Al electrodes and the semi-insulating film, poor appearance, reduced resistance between isolated Al lines (which may ultimately lead to shorting therebetween), and degraded reliability of the device while allowing the semi-insulating film to have the intended effect of increasing the dielectric strength of the device.

Further according to the method of the present embodiment for manufacturing a semiconductor device, the interlay films 16 also act as electrodes, thereby serving to increase the electrical contact area between the Al electrodes 14 on the P-type regions 12 and the overlying semi-insulating film 18. This reduces the resistance between the semi-insulating film 18 and the Al electrodes 14, resulting in an increased safety margin against electrical breakdown.

Further, at step 106 shown in FIG. 2, the resist pattern 50 is stripped off immediately after portions of the film layer 15 are removed by wet etching, as described above. It should be noted that in conventional methods the resist pattern 50 is used as a mask to remove portions of both the film layer 15 and the Al electrode layer 13, not the film layer 15 alone, by wet etching. In such a case, resist material that has absorbed chemical solution used in the wet etching process may come into contact with the Al electrode layer and may etch the portions thereof which must be left unetched. The method of the present embodiment avoids this problem by stripping off the resist pattern immediately after the wet etching of the film layer 15, as described above.

Figure 9:
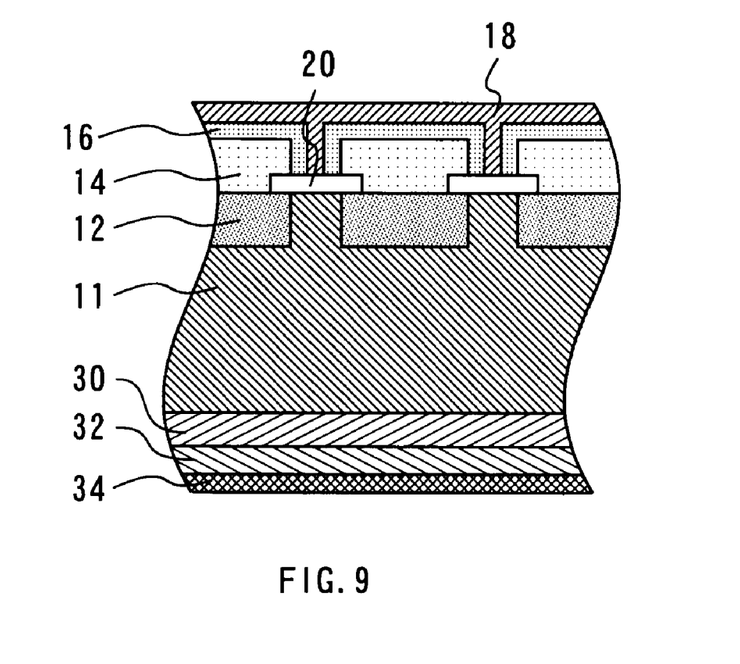
FIG. 9 shows interlayer films which covers entire exposed surfaces of the Al electrodes.

In the semiconductor device 10 described in connection with the present embodiment, the sidewalls of the Al electrodes 14 are in direct contact with the semi-insulating film 18, and therefore the Al electrodes 14 may react with Si in the semi-insulating film 18 through these sidewalls. To prevent this, the interlayer films 16 may be formed so as to cover the entire exposed surfaces of the Al electrodes 14, as shown in FIG. 9. This ensures that the Al electrodes 14 is not in direct contact with the semi-insulating film 18, thereby more reliably preventing the above chemical reaction.

It is to be understood that the advantages of the present invention can be achieved at least to some extent even if the interlayer films 16 covers only partially the Al electrodes 14, i.e., even if some portions of the Al electrodes 14 are in direct contact with the semi-insulating film 18. That is, it is not necessary to completely separate the Al electrodes 14 from the semi-insulating film 18 by the interlayer films 16. Which portions of the Al electrodes 14 are covered with the interlayer films 16 and to what extent are left to the particular design of the semiconductor device and are restricted only by the scope of the present invention.

Figure 10:
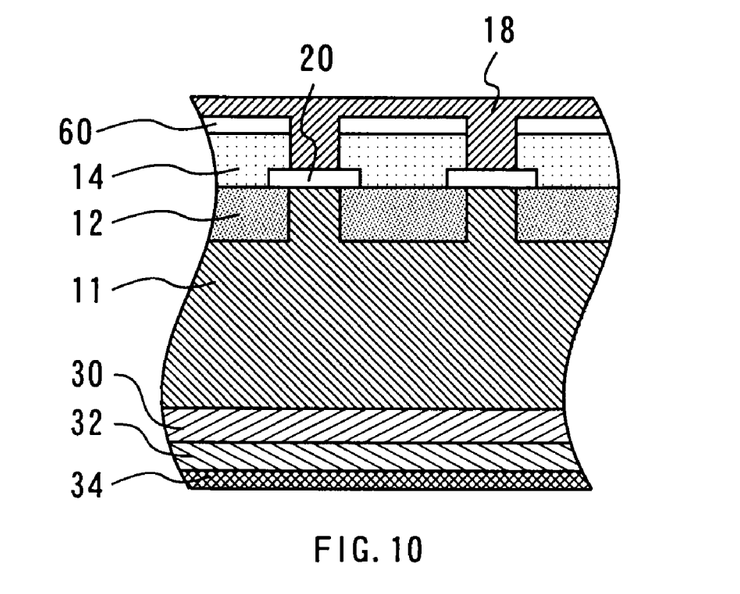
FIG. 10 shows deformation of interlayer films having a different composition.
Figure 11:
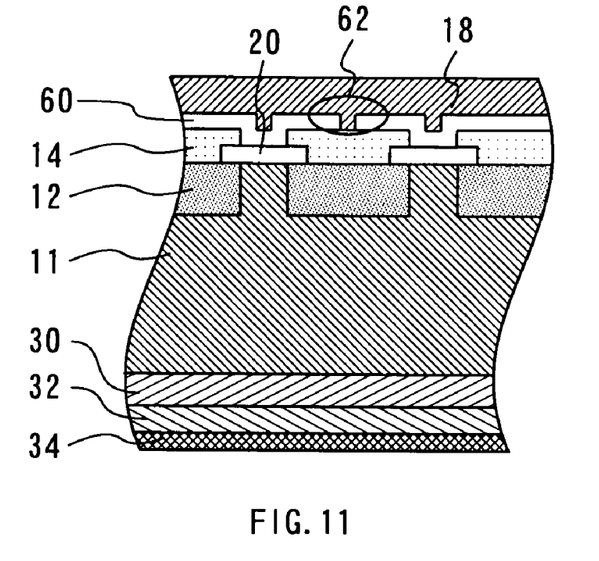
FIG. 11 shows deformation of interlayer films having a different composition.

Although in the present embodiment the interlayer films 16 are conductive metal films of TiN, it is to be understood that they may be made of any suitable material which is less reactive with Si than is Al. Therefore, the interlayer films 16 may be metal films of a different metal, or insulating films. FIG. 10 shows a semiconductor device which differs from that of the present embodiment only in that the interlayer films 16 are replaced by interlayer films 60. The semiconductor device shown in FIG. 11 differs from that of the present embodiment in that the interlayer films 16 are replaced by a single interlayer film 60. (These semiconductor devices can be manufactured by the same process steps as described in connection with the present embodiment.) These interlayer films 60 may be insulating films of TEOS (tetraethoxysilane) or SiN. Alternatively, they may be insulating films of AlN formed by injecting nitrogen after the formation of the Al electrodes 14.

These semiconductor devices still retain the advantages of the present invention. In the semiconductor device shown in FIG. 11, the single interlayer film 60 covers most of the surface of the Al electrodes 14 (or nearly completely separates the Al electrodes 14 from the semi-insulating film 18), thereby reliably preventing the reaction of the Al electrodes 14 with Si contained in the semi-insulating film 18. However, in order for the semi-insulating film 18 to have the intended effect of increasing the dielectric strength of the device, the interlayer film 60 has an opening (or contact portion) 62 to allow an Al electrode to be in direct contact with the semi-insulating film 18 (see FIG. 11).

Figure 12:
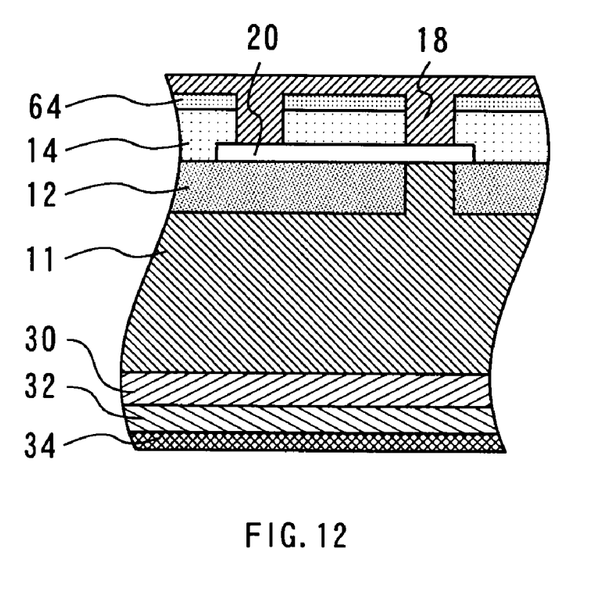
FIG. 12 shows the device region of IGBT.

The semiconductor device of the present embodiment has been described as being a peripheral region of an IGBT, etc. which region contains guard rings (or dielectric strength enhancing structures). It is to be understood, however, that the present embodiment may be applied to the device region, in which gate and emitter electrodes are formed. An example of such a device region will be described with reference to FIG. 12. FIG. 12 primarily shows the device region of an IGBT. The device region shown in FIG. 12 includes a guard ring (shown to the right in FIG. 12) and three Al electrodes 14, namely, an emitter electrode, a gate electrode, and the electrode on the guard ring, as viewed from left to right in FIG. 12.

The P-type region 12 in direct contact with the emitter electrode is a P-base, and the other P-type region spaced from the P-base is the guard ring. The gate electrode is not in contact with the P-base but is separated therefrom by an interlayer film 20, as shown in FIG. 12. The gate electrode is connected to a known trench gate or gates.

Interlayer films 64 are disposed on the respective Al electrodes 14, and a semi-insulating film 18 covers the interlayer films 64 and the Al electrodes 14. This device region also has the advantages described above in connection with the present embodiment. Thus the present invention can be applied to increase the dielectric strength of various regions or structures in which Al electrodes are covered with a semi-insulating film for stabilizing the potentials of these electrodes.

Although the semi-insulating film described in connection with the present embodiment is a semi-insulating nitride film containing Si, it may be any suitable Si-containing semi-insulating film such as an SIPOS (semi-insulating polycrystalline silicon) film.

Although the foregoing description of the present embodiment indicates that the Al electrodes react with Si in the semi-insulating film at 400° C., it is to be understood that the temperature at which this reaction occurs depends on the compositions, etc. of the Al electrodes and the semi-insulating film. It is considered that the lower the Si concentration of the Al electrodes, the more readily the Al electrodes react with Si in the semi-insulating film. Further, the extent to which the Al electrodes can be allowed to react with Si in the semi-insulating film (determined by reliability requirements) differs in different semiconductor devices, even of the same type. Therefore, the method of the present embodiment may be applied to the manufacture of a semiconductor device in which the substrate temperature is set at a temperature other than 400° C.

Further, the method of the present embodiment may not include the heat treatment step 112 (shown in FIG. 2), and the semi-insulating film forming step 110 (shown in FIG. 2) may be performed at a temperature high enough to cause, in the absence of the interlayer films, the chemical reaction of the Al electrodes with Si in the semi-insulating film.

Second Embodiment

A second embodiment of the present invention relates to a method for manufacturing a semiconductor device which is similar to that described in connection with the first embodiment but which is further adapted to ensure proper wire bonding. This method also has the advantages described in connection with the first embodiment.

Figure 13:
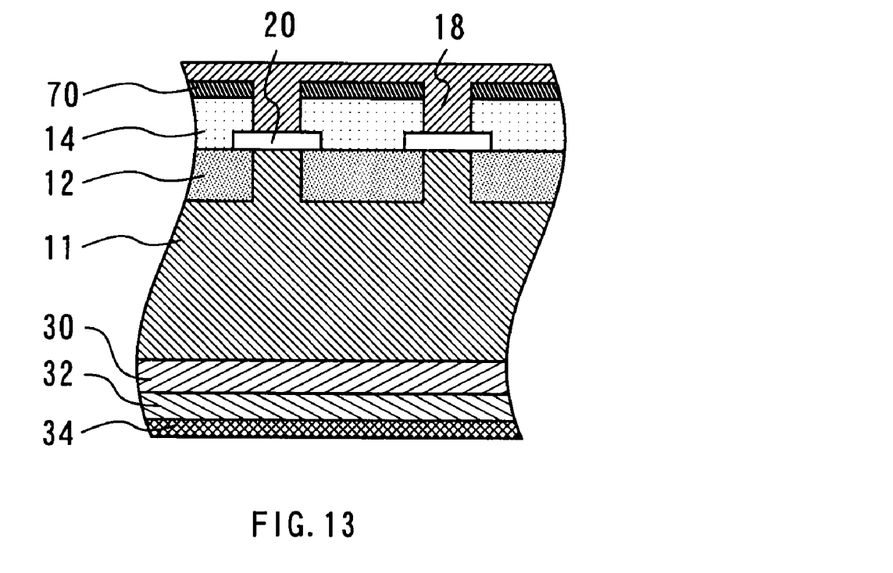
FIG. 13 is a cross sectional view of the peripheral region.
Figure 14:
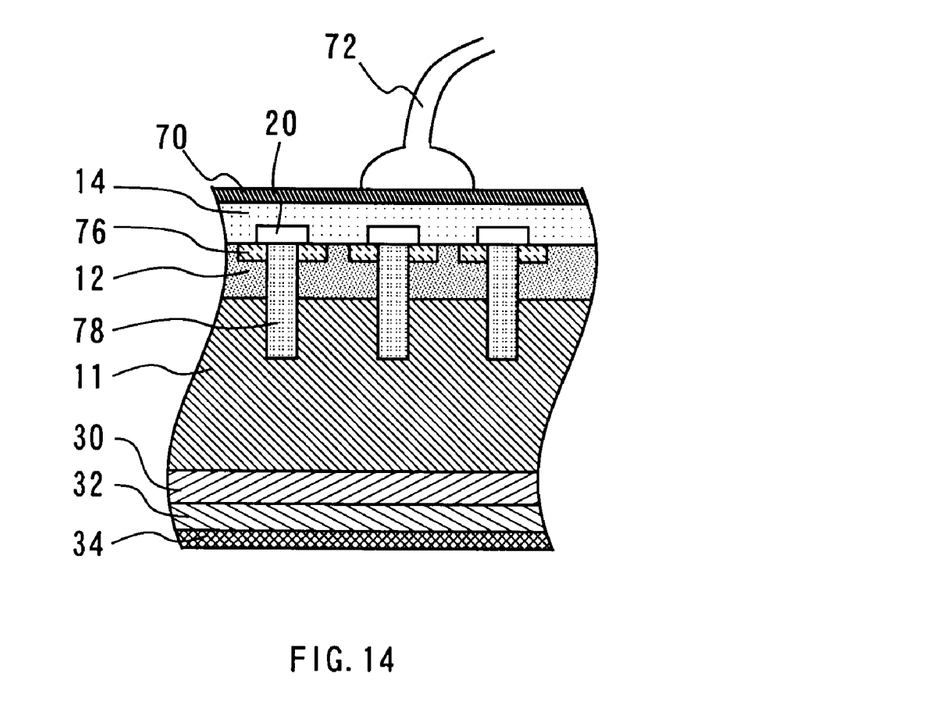
FIG. 14 shows an interlayer film formed over an Al electrode.

FIGS. 13 and 14 show a semiconductor device manufactured by the method of the present embodiment. Specifically, FIG. 14 is a cross-sectional view primarily showing its device region, and FIG. 13 is a cross-sectional view of a peripheral region (or dielectric strength enhancing region) formed around the device region and including P-type regions (or guard rings) 12. The device region and the peripheral region are formed in the same substrate but separately shown in FIGS. 14 and 13, respectively, for convenience of explanation.

First, the dielectric strength enhancing region of the present embodiment will be described with reference to FIG. 13. This dielectric strength enhancing region is formed by the same process as illustrated by the flowchart of FIG. 2 (described above in connection with the first embodiment) except that the interlayer films are made of AlSi containing at least 1% of Si. These interlayer films are denoted by reference numeral 70 in FIG. 13. It should be noted that the solubility of Si in Al is 0.8% at 500° C., as is known in the art. This means that these AlSi interlayer films 70 containing at least 1% of Si are supersaturated with Si, which allows the interlayer films 70 to prevent the reaction of the Al electrodes 14 with Si in the semi-insulating film 18.

According to the present embodiment, the device region also includes an interlayer film 70 formed over an Al electrode 14, as shown in FIG. 14. This Al electrode 14 serves as the emitter electrode of an IGBT. The interlayer film 70 in the device region is formed in the same process step as the interlayer films 70 in the dielectric strength enhancing region shown in FIG. 13, eliminating the need for an additional process step. It should be noted that in FIG. 14 reference numerals 76 and 78 denote emitters and trench gates, respectively.

The device region also includes a wire 72 on its interlayer film 70. This wire 72 is formed by a known ultrasonic wire bonding process after the formation of the interlayer film 70. The surface of the interlayer film 70 is not covered by a semi-insulating film and is exposed so that wire bonding can be performed thereto in the wire bonding process.

The AlSi interlayer film 70, which contains at least 1% of Si, has a higher hardness than pure Al. This means that ultrasonic wiring bonding to the interlayer film 70 causes less damage to the MOS portion than ultrasonic wiring bonding to the Al electrode 14 (i.e., emitter electrode), resulting in a reduced chance of gate failure and an increased resistance to wire bonding stress.

Thus according to the method of the present embodiment for manufacturing a semiconductor device, AlSi interlayer films containing at least 1% of Si are formed on the Al electrodes to effectively prevent the reaction of these electrodes with Si in the semi-insulating film. Further, the device region has an increased resistance to wiring bonding stress, since wire bonding is performed to its AlSi interlayer film, not to its Al electrode (or emitter electrode). (It should be noted that this does not involve an additional process step.)

It will be understood that various alterations may be made to the method of the present embodiment for manufacturing a semiconductor device without departing from the scope of the present invention. For example, the interlayer films 70 can be formed by injecting Si into the surface of the Al electrode layer (which will become the Al electrodes) after its deposition. Further, wire bonding may be performed to a region other than the device region.

Third Embodiment

A third embodiment of the present invention relates to a method for manufacturing a semiconductor device which is similar to that described in connection with the first embodiment but which includes aluminum oxide films, such as $Al_2O_3$ or $AlO_3$, serving as interlayer films.

Figure 15:
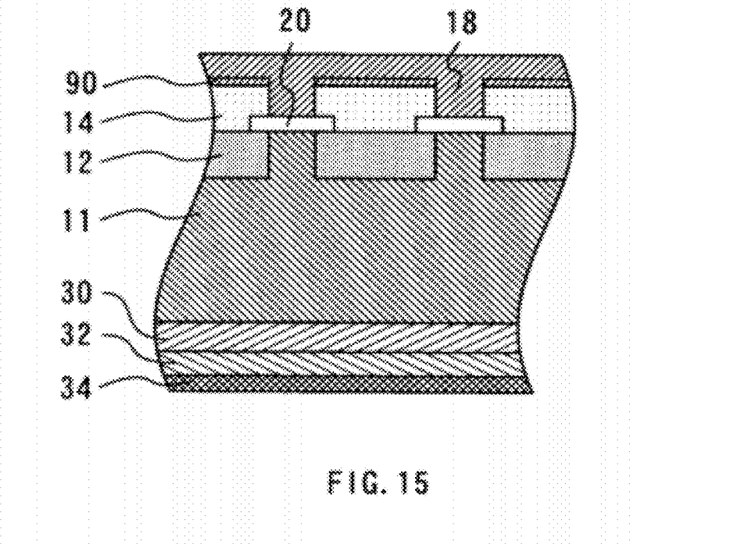
FIG. 15 is a cross-sectional view of a semiconductor device manufactured by the method of the third embodiment.

FIG. 15 is a cross-sectional view of a semiconductor device manufactured by the method of the present embodiment. This semiconductor device is similar to that shown in FIG. 1 except that it includes interlayer films 90 instead of the interlayer films 16. These interlayer films 90 are aluminum oxide such as $Al_2O_3$ or $AlO_3$, as described above.

Figure 16:
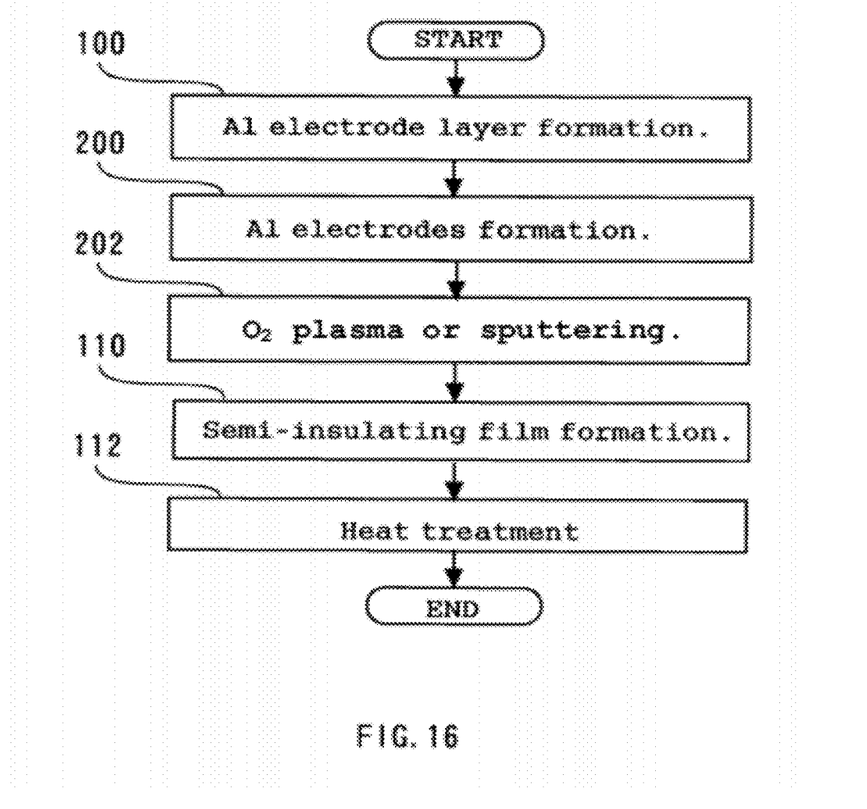
FIG. 16 is a flowchart illustrating the method of the third embodiment.

FIG. 16 is a flowchart illustrating the method of the present embodiment for manufacturing a semiconductor device. First, an Al electrode layer 13 is formed at step 100. Next, the Al electrode layer is partially etched away at step 200. Specifically, the portions of the Al electrode layer 13 which are not on the P-type regions 12 are etched away by a known technique using a resist, thereby forming Al electrodes 14.

Figure 17:
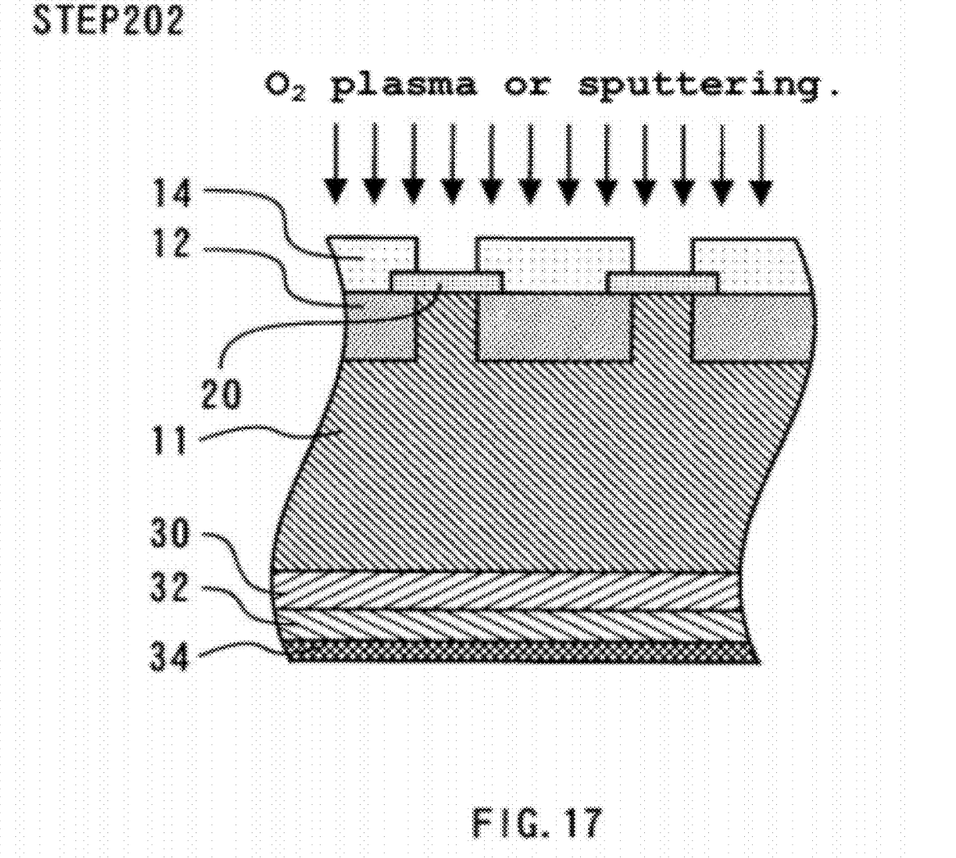
FIG. 17 shows the O2 plasma treatment.

The method then proceeds to step 202 at which the surfaces of the Al electrodes 14 are oxidized by $O_2$ plasma treatment. More specifically, as illustrated by FIG. 17, the surfaces of Al electrodes 14 are subjected to $O_2$ plasma to form aluminum oxide interlayer films 90 of $Al_2O_3$ or $AlO_3$ thereon. Then a semi-insulating film is formed at step 110, and the substrate is heat treated at step 112.

The present embodiment is characterized in that aluminum oxide films of $Al_2O_3$ or $AlO_3$ serving as interlayer films are formed on the Al electrodes. Since $Al_2O_3$ (alumina) is especially chemically stable (i.e., substantially nonreactive), the use of $Al_2O_3$ films as the interlayer films reliably prevents the reaction of the Al electrodes 14 with Si in the semi-insulating film 18, thereby increasing the dielectric strength of the semiconductor device, as in the first embodiment. Further, since the interlayer films 90 of the present embodiment are thin films, their formation on the top surfaces of the Al electrodes causes little stress in the substrate (of Si), which means that there results a smaller change in the characteristics of the device region or the semiconductor device, as compared to conventional interlayer films.

It should be noted that the interlayer films 90 may be formed by Al sputtering in an $O_2$ atmosphere, instead of oxidizing the surfaces of the Al electrodes with $O_2$ plasma, at step 202. This Al sputtering can be performed in the same aluminum sputtering system as used in step 200. More specifically, the aluminum oxide interlayer films 90 of $Al_2O_3$ or $AlO_3$ may be formed by Al sputtering in an atmosphere of $O_2$ (or a mixture of $O_2$ and noble gas) by introducing $O_2$ into the Al sputtering system, resulting in the same advantages as described above in connection with the present embodiment. Thus in this case the interlayer films 90 can be formed in the same Al sputtering system as used in the previous step by changing the atmospheric conditions in the system, thereby simplifying the manufacturing process and eliminating the need for an additional process step.

Thus the present invention solves the problems of the prior art by providing an improved method for manufacturing a semiconductor device having Al electrodes covered with a semi-insulating film.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-228084, filed on Sep. 5, 2008 including specification, claims, drawings and summary, on which the Convention priority of the present application is based, are incorporated herein by reference in its entirety.

What is claimed is:

1. A method for manufacturing a semiconductor device, comprising the steps of:
    forming a P-type region on a surface of a semiconductor substrate;
    forming at least one Al electrode on said P-type region;
    forming a conductive interlayer film in contact with said at least one Al electrode, said interlayer film being of a material which is less reactive with Si than is Al; and
    forming a semi-insulating film in direct contact with said interlayer film, said semi-insulating film containing Si.

2. The method as claimed in claim 1, wherein said P-type region is a guard ring formed around a device region.

3. The method as claimed in claim 1, wherein: said interlayer film is a metal film; and said at least one Al electrode is not in direct contact with said semi-insulating film but is separated therefrom by said interlayer film.

4. The method as claimed in claim 1, further comprising, after said interlayer film forming step and before said semi-insulating film forming step, the steps of:
    applying a resist to said interlayer film;

forming a predetermined resist pattern by photolithography, said resist pattern having an opening therein which exposes a portion of said interlayer film;

etching said exposed portion of said interlayer film;

stripping off said resist pattern after said interlayer film etching step; and etching said at least one Al electrode using said interlayer film as a mask after said resist stripping step.

5. The method as claimed in claim 1, wherein:

said P-type region is a P-base layer in a device region; and said at least one Al electrode is a gate electrode and an emitter electrode, said gate electrode being formed on an interlayer insulating film on said P-base layer, said emitter electrode being formed on said P-base layer.

6. The method as claimed in claim 5, wherein:

said interlayer film is AlSi containing at least 1% of Si; and said method further comprises the steps of:

removing a portion of said semi-insulating film on said interlayer film to expose a surface portion of said interlayer film; and performing wire bonding to said exposed surface portion of said interlayer film.

7. A method for manufacturing a semiconductor device, comprising:

forming a P-type region on a surface of a semiconductor substrate;

forming at least one Al electrode on said P-type region;

forming an interlayer film over and in contact with said at least one Al electrode, said interlayer film being an insulating film which is less reactive with Si than is Al; and forming a semi-insulating film in contact with said interlayer film, said semi-insulating film containing Si, wherein a portion of said at least one Al electrode is in direct contact with said interlayer film, another portion of said at least one Al electrode is in direct contact with said semi-insulating film, and an area where the Al electrode contacts with the interlayer film is larger than an area where the Al electrode contacts with the semi-insulating film.

8. The method as claimed in claim 7, wherein said interlayer film forming step includes applying $O_2$ plasma treatment to a surface of said at least one Al electrode.

9. The method as claimed in claim 7, wherein said interlayer film forming step includes forming $Al_2O_3$ on a surface of said at least one Al electrode in an Al sputtering system containing $O_2$ gas.

10. The method as claimed in claim 7, wherein said P-type region is a guard ring formed around a device region.

11. The method as claimed in claim 7, further comprising, after said interlayer film forming step and before said semi-insulating film forming step, the steps of:

applying a resist to said interlayer film;

forming a predetermined resist pattern by photolithography, said resist pattern having an opening therein which exposes a portion of said interlayer film;

etching said exposed portion of said interlayer film;

stripping off said resist pattern after said interlayer film etching step; and etching said at least one Al electrode using said interlayer film as a mask after said resist stripping step.

12. The method as claimed in claim 7, wherein:

said P-type region is a P-base layer in a device region; and said at least one Al electrode is a gate electrode and an emitter electrode, said gate electrode being formed on an interlayer insulating film on said P-base layer, said emitter electrode being formed on said P-base layer.

* * * * *